United States Patent
Komiyama et al.

(10) Patent No.: US 8,304,731 B2
(45) Date of Patent: Nov. 6, 2012

(54) INFRARED LIGHT DETECTOR

(75) Inventors: Susumu Komiyama, Tokyo (JP); Zhenghua An, Tokyo (JP); Takeji Ueda, Tokyo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 750 days.

(21) Appl. No.: 12/527,614

(22) PCT Filed: Feb. 1, 2008

(86) PCT No.: PCT/JP2008/051679
§ 371 (c)(1),
(2), (4) Date: Aug. 18, 2009

(87) PCT Pub. No.: WO2008/102630
PCT Pub. Date: Aug. 28, 2008

(65) Prior Publication Data
US 2010/0116989 A1     May 13, 2010

(30) Foreign Application Priority Data

Feb. 19, 2007   (JP) .................... 2007-038176

(51) Int. Cl.
*H01L 31/00* (2006.01)
(52) U.S. Cl. .................................... 250/338.4
(58) Field of Classification Search ........... 250/338.1, 250/338.4; 257/E31.001
See application file for complete search history.

(56) References Cited

U.S. PATENT DOCUMENTS 6,455,872 B1 * 9/2002 Williams et al. ............. 257/14

FOREIGN PATENT DOCUMENTS

| JP | 11-004017 | 1/1999 |
| JP | 2001-060699 | 3/2001 |
| WO | 01/06572 | 1/2001 |
| WO | 2006/006469 | 1/2006 |

OTHER PUBLICATIONS

"A sensitive double quantum well Infrared phototransistor", Zhenghua An et al., Journal of Applied Physics 100, 044509 (2006), pp. 1-7.
"Metastable excited states of a closed quantum dot with high sensitivity to infrared p0hotons", Zhenghua An et al., Physical Review B 75, 085417 (2007), pp. 1-7.
"Reset Operation of Quantum-Well Infrared Phototransistors", Zhenghua An et al., IEEE Transactions on Electron Devices, vol. 54, No. 7, Jul. 2007, pp. 1776-1780.
"Infrared phototransistor using capacitively coupled two-dimensional electron gas layers", Zhenghua An et al., Applied Physics Letters 86, 172106 (2005), pp. 1-3.

* cited by examiner

*Primary Examiner* — David Porta
*Assistant Examiner* — Faye Boosalis
(74) *Attorney, Agent, or Firm* — Rankin, Hill & Clark LLP

(57) ABSTRACT

An infrared light detector with an infrared light sensitivity thereof further improved. According to the infrared light detector, an isolated region of a first electronic layer is switched between a "disconnected status" and a "connected status". Under the connected status, saturation of an electrostatic charge quantity of the isolated region in the disconnected status is eliminated, and consequently, saturation of a variation amount of an electrical conductivity of a second electronic layer is eliminated. Therefore, the infrared light sensitivity is further improved by time integration of the variation amount of the electrical conductivity of the second electronic layer.

9 Claims, 6 Drawing Sheets

INFRARED LIGHT DETECTOR

PRIORITY CLAIM

The present application is based on and claims the priority benefit of Japanese Patent Application 2007-038176 filed on Feb. 19, 2007, the contents of which are incorporated herein by reference in its entirety.

BACKGROUND OF THE INVENTION

1. Field of the Invention

The present invention relates to an infrared light detector.

2. Description of the Related Art

There has been disclosed an infrared light detector by the inventors of the present application using the phenomenon described in, for example, published PCT international application WO2006/006469A1, "Infrared phototransistor using capacitively coupled two-dimensional electron gas layers" (An et al.) Appl. Phys. Lett., 86, 172106(2005), and "A sensitive double quantum well infrared phototransistor" (An et al.) J. Appl. Phys., 100, 044509(2006). Specifically, by a microstrip antenna or the like, a ray of infrared light is concentrated on a two-dimensional electronic layer, such as a quantum dot or the like, which is electrically isolated from the ambient. As a result, a vertical oscillating electric field is generated in the isolated two-dimensional electronic layer. Thereafter, an electron in the isolated two-dimensional electronic layer is excited by the oscillating electric field a ground sub-band level to an excited sub-band level and then escapes from the isolated two-dimensional electronic layer to a source electrode or the like in a charge sensitive transistor disposed underneath the isolated two-dimensional electronic layer. Thereby, the isolated two-dimensional electronic layer becomes positively charged. The electrical charge of the isolated two-dimensional electronic layer increases gradually as the number of electrons escaped from the isolated two-dimensional electronic layer increases gradually, and resultantly, the electrical conductivity of the charge sensitive transistor increases.

When a single infrared light photon is introduced into the antenna, the infrared light detector using the above-mentioned phenomenon can detect the infrared light with a high sensitivity on the basis of the current variation of a charge sensitive transistor.

However, in the infrared light detector, the current variation amount of the charge sensitive transistor becomes saturated in a relatively short time after the detection of the infrared light is initiated, therefore, it has been proved that there is a limit on infrared light sensitivity.

SUMMARY OF THE INVENTION

The present invention has been accomplished in view of the aforementioned problems, and it is therefore an object of the present invention to provide an infrared light detector with further improved infrared light sensitivity surpassing the sensitivity limit of a conventional art.

The present invention is related to an infrared light detector having a first electronic layer as a two dimensional electronic layer; an excitation mechanism configured to excite an electron in the first electronic layer between sub-bands in a quantum well formed in an electrically isolated region by an oscillating electric field component perpendicular to the first electronic layer induced by an incident infrared light; and a second electronic layer disposed below the first electronic layer through an interlayer within a distance by which an electrostatic force of the first electronic layer influences on the second electric layer, whose electrical conductivity varies because of an electrical charge of the isolated region varied by the flowing out of the electron excited by the excitation mechanism from the isolated region. The infrared light detector detects the incident infrared light by detecting a variation pattern on the electrical conductivity of the second electronic layer.

The inventors of the present application discovered after research that there is a limit on the infrared light sensitivity of the infrared light detector due to the reasons to be described hereinafter. That is, when the incident infrared light is falling on the infrared light detector, the number of electrons escaped from the electrically isolated region in the first electronic layer gradually increases; as a result thereof, the electrical charge of the isolated region also increases gradually. According thereto, the energy level of the excited sub-band in the quantum well formed in the isolated region decreases gradually and approaches to the energy level where the electron escaped, such as the second electronic layer or the like. Consequently, it will become more and more difficult for the electron to escape from the isolated region, causing the electrical charge of the isolated region to become saturated. Therefore, even though the infrared light is further falling on the infrared light detector, the electrical conductivity of the second electronic layer is prevented from varying anymore, which makes impossible a further detection of the infrared light which is based on the determination of the electrical conductivity.

In consideration of the above research result, the infrared light detector according to a first aspect of the present invention includes a status controlling mechanism configured to perform switching between a disconnected status in which an electron from an outer electron system is limited or prohibited from flowing into the isolated region and a connected status in which an electron from the outer electron system is permitted to flow into the isolated region according to the detection result of the variation pattern on the electrical conductivity of the second electronic layer in detecting the infrared light.

According to the infrared light detector of the first aspect of the present invention, before the electrical charge of the isolated region in the first electronic layer, and consequently the electrical conductivity (conductance/admittance/susceptance) of the second electronic layer, becomes saturated in the disconnected status, the disconnected status is switched to the connected status. Thereby, the electron from the outer electron system flows into the isolated region, and recombines with the positive charges accumulated in the isolated region; as a result thereof, the electrical charge of the isolated region is instantly reset to zero.

Thereafter, as the status is switched from the connected status to the disconnected status, the energy level of the excited sub-band in the quantum well of the isolated region is restored to a level high enough for the electron which has been transitioned to the excited sub-band to escape again from the isolated region of the first electronic layer. Therefore, the variation pattern of the electrical conductivity of the second electronic layer can be detected again. Herein, the "variation pattern" of the electrical conductivity is a concept including a variation amount of the electrical conductivity in a predefined time interval after the electrical charge of the isolated region has been reset, in addition to a temporal variation rate of the electrical conductivity.

Therefore, as the infrared light is being detected, the disconnected status and the connected status are alternatively switched so that the variation pattern of the electrical conductivity of the second electronic layer in the disconnected status can be accumulatively detected or integrated with time, which makes it possible to improve the infrared light sensitivity to surpass the infrared light sensitivity limit aforementioned.

A second aspect of the present invention is dependent on the first aspect of the present invention, wherein the status controlling mechanism includes a first gate electrode formed on an upper surface of the first electronic layer to separate the isolated region from a connection region in the first electronic layer where the outer electron system is connected, and a first voltage controller configured to adjust a magnitude of a potential barrier formed between the isolated region and the connection region in the first electronic layer by controlling a bias voltage applied to the first gate electrode.

According to the infrared light detector of the second aspect of the present invention, the potential barrier can be formed between the isolated region and the connection region to the outer electron system in the first electronic layer when the bias voltage is applied to the first gate electrode. The bias voltage can be adjusted to control the magnitude or existence of the potential barrier, and consequently, enabling the switching between the disconnected status where the isolated region is electrically isolated from the outer electron system and the connected status where the isolated region is electrically connected to the outer electron system.

A third aspect of the present invention is dependent on the second aspect of the present invention, wherein an area of an overlapped portion between the first electronic layer and the first gate electrode, and the bias voltage applied to the first gate electrode are controlled to satisfy a first condition that the electrical charge of the isolated region is prevented from being varied by the bias voltage applied to the first gate electrode if there is no incident infrared light.

According to the infrared light detector of the third aspect of the present invention, the area of the overlapped portion between the first electronic layer and the first gate electrode, and the bias voltage applied to the first gate electrode are controlled to satisfy the first condition. Thereby, the electrical charge of the isolated region can be prevented from being varied by the bias voltage applied to the first gate electrode if there is no incident infrared light.

Specifically, by applying the bias voltage to the first gate electrode, the number of electrons forced to flow into the isolated region from a region beneath the first gate electrode in the first electronic layer can be inhibited. Herein, "an electron is forced to flow into the isolated region from a region beneath the first gate electrode in the first electronic layer" means that a region where an electron is removed repulsively becomes wider according to the potential barrier formed in the region in the first electronic layer, therefore, the isolated region becomes smaller essentially. As a result thereof, (1) Electrons in the isolated region become concentrated after the electron is forced into the isolated region, therefore, the positive electrical charge in the isolated region can be prevented from decreasing or the negative electrical charge thereof is prevented from increasing regardless of the incident infrared light. (2) Electrons in the isolated region become concentrated after the electron is forced into the isolated region, the Fermi level in the isolated region is increased; therefore, partial electrons are prevented from escaping from the isolated region to the second electronic layer or the like. Since the electrical charge of the isolated region, and consequently, the electrical conductivity of the second electronic layer is prevented from varying when there is no incident infrared light, the infrared light detection sensitivity can be maintained at a high level. It is especially significant in maintaining an infrared light detector of a small size at a high level.

A fourth aspect of the present invention is dependent on the first aspect of the present invention, wherein the status controlling mechanism performs switching between the disconnected status and the connected status in detecting the infrared light, taking the second electronic layer or an ohmic contact connected to the second electronic layer as the outer electronic system.

According to the infrared light detector of the fourth aspect of the present invention, the electrical charge of the isolated region and the electrical conductivity of the second electronic layer can be varied by making the electron escape from the isolated region in the first electronic layer to the second electronic layer or an ohmic contact connected to the second electronic layer in the disconnected status as aforementioned. On the other hand, in the connected status, by making the electron flow into the isolated region in the first electronic layer from the second electronic layer or the ohmic contact, the electrical charge of the isolated region can be reset to zero as aforementioned.

A fifth aspect of the present invention is dependent on the first aspect of the present invention, wherein the status controlling mechanism performs switching from the disconnected status to the connected status in accordance with the variation pattern on the electrical conductivity of the second electronic layer in the disconnected status before a variation amount of the electrical conductivity becomes saturated.

According to the infrared light detector of the fifth aspect of the present invention, since the disconnected status is switched to the connected status before the variation amount of the electrical conductivity of the second electronic layer in the disconnected status becomes saturated, the detection accuracy of the infrared light can be further improved by getting rid of the effects from the saturation.

A sixth aspect of the present invention is dependent on the first aspect of the present invention, wherein the first electronic layer is respectively connected to a source electrode and a drain electrode which are connected to the second electronic layer so as to determine the electrical conductivity of the second electronic layer, the first electronic layer includes a second gate electrode formed on a upper surface of the first electronic layer to partition the isolated region and a connection region in the first electronic layer where the source electrode and the drain electrode are connected, respectively, and a second voltage controller configured to form a potential barrier between the isolated region and the connection region in the first electronic layer by controlling a bias voltage applied to the second gate electrode.

According to the infrared light detector of the sixth aspect of the present invention, a potential barrier between the isolated region and the connection region connected respectively to the source electrode and the drain electrode in the first electronic layer is formed by applying a bias voltage to the second gate electrode. Therefore, by adjusting the bias voltage, the magnitude or existence of the potential barrier can be adjusted; and as a result thereof, the isolated region can be maintained in the disconnected status electrically isolated from the source electrode, the drain electrode and the second electronic layer.

A seventh aspect of the present invention is dependent on the first aspect of the present invention, wherein the bias voltage applied to the second gate electrode is controlled to satisfy a second condition that a variation amount or variation rate of the electrical conductivity of the second electronic layer due to the potential barrier formed in the second electronic layer is prevented from decreasing or disappearing.

According to the infrared light detector of the seventh aspect of the present invention, the bias voltage applied to the second gate electrode is so limited as to satisfy the second condition. According thereto, the potential barrier can be prevented from being formed in the second electronic layer according to the application of the bias voltage to the second gate electrode, and consequently, the infrared light detection sensitivity can be prevented from decreasing.

An eighth aspect of the present invention is dependent on the first aspect of the present invention, wherein the first electronic layer is of a T shape, including a central region where the isolated region is formed, a pair of wing-like regions of a wide width extended from both sides of the central region, respectively, and a belt-like region of a narrow width extended from the central region; the second electronic layer is of the same shape as the first electronic layer and is disposed to overlap with the first electronic layer in a vertical direction; the wing-like region at the left side of the first electronic layer and the second electronic layer is connected with a first ohmic contact, the wink-like region at the right side thereof is connected with a second ohmic contact, and the belt-like region is connected with a third ohmic contact; the status controlling mechanism includes a first gate electrode formed on an upper surface of the belt-like region in the first electronic layer to separate the central region from the third ohmic contact, and a first voltage controller configured to adjust a magnitude of a potential barrier formed between the central region and the third ohmic contact in the first electronic layer by controlling a bias voltage applied to the first gate electrode; the infrared light detector includes a second gate electrode formed on an upper surface of the first electronic layer without overlapping with the belt-like region to separate the central region from the pair of wing-like regions, and a second voltage controller configured to form a potential barrier for defining the isolated region between the central region and the pair of wing-like region in the first electronic layer by adjusting a bias voltage applied to the second gate electrode.

According to the infrared light detector of the eighth aspect of the present invention, when the T-shaped infrared light detector is used to detect the infrared light, the disconnected status and the connected status are alternatively switched, therefore, the variation pattern of the electrical conductivity of the second electronic layer in the disconnected status is detected accumulatively, which makes it possible to improve the infrared light sensitivity, surpassing the infrared light sensitivity limit aforementioned.

A ninth aspect of the present invention is dependent on the first aspect of the present invention, wherein the first electronic layer is of a P shape, including a central region where the isolated region is formed, a pair of wing-like regions of a wide width extended from both sides of the central region, respectively, and a loop-like region connected to the central region and one of the wing-like regions; the second electronic layer is of the same shape as the first electronic layer and is disposed to overlap with the first electronic layer in a vertical direction; the wing-like region at the left side of the first electronic layer and the second electronic layer is connected with a first ohmic contact, the wink-like region at the right side thereof is connected with a second ohmic contact, and the belt-like region is connected with a third ohmic contact; the status controlling mechanism includes a first gate electrode formed on an upper surface of the loop-like region in the first electronic layer to separate the central region from the third ohmic contact, and a first voltage controller configured to adjust a magnitude of a potential barrier formed between the central region and the third ohmic contact in the first electronic layer by controlling a bias voltage applied to the first gate electrode; the infrared light detector includes a second gate electrode formed on an upper surface of the first electronic layer without overlapping with the loop-like region to separate the central region from the pair of wing-like regions, and a second voltage controller configured to form a potential barrier for defining the isolated region between the central region and the pair of wing-like region in the first electronic layer by adjusting a bias voltage applied to the second gate electrode.

According to the infrared light detector of the ninth aspect of the present invention, when the P-shaped infrared light detector is used to detect the infrared light, the disconnected status and the connected status are alternatively switched, therefore, the variation pattern of the electrical conductivity of the second electronic layer in the disconnected status is detected accumulatively, which makes it possible to improve the infrared light sensitivity, surpassing the infrared light sensitivity limit aforementioned.

BRIEF DESCRIPTION OF THE DRAWINGS

FIG. 2 (a) and FIG. 2(b) are sectional view-views of the infrared light detector according to the present invention.

DETAILED DESCRIPTION OF THE PREFERRED EMBODIMENTS

Hereinafter, an embodiment of an infrared light detector according to the present invention will be described in detail with reference to the drawings.

Figure 1:
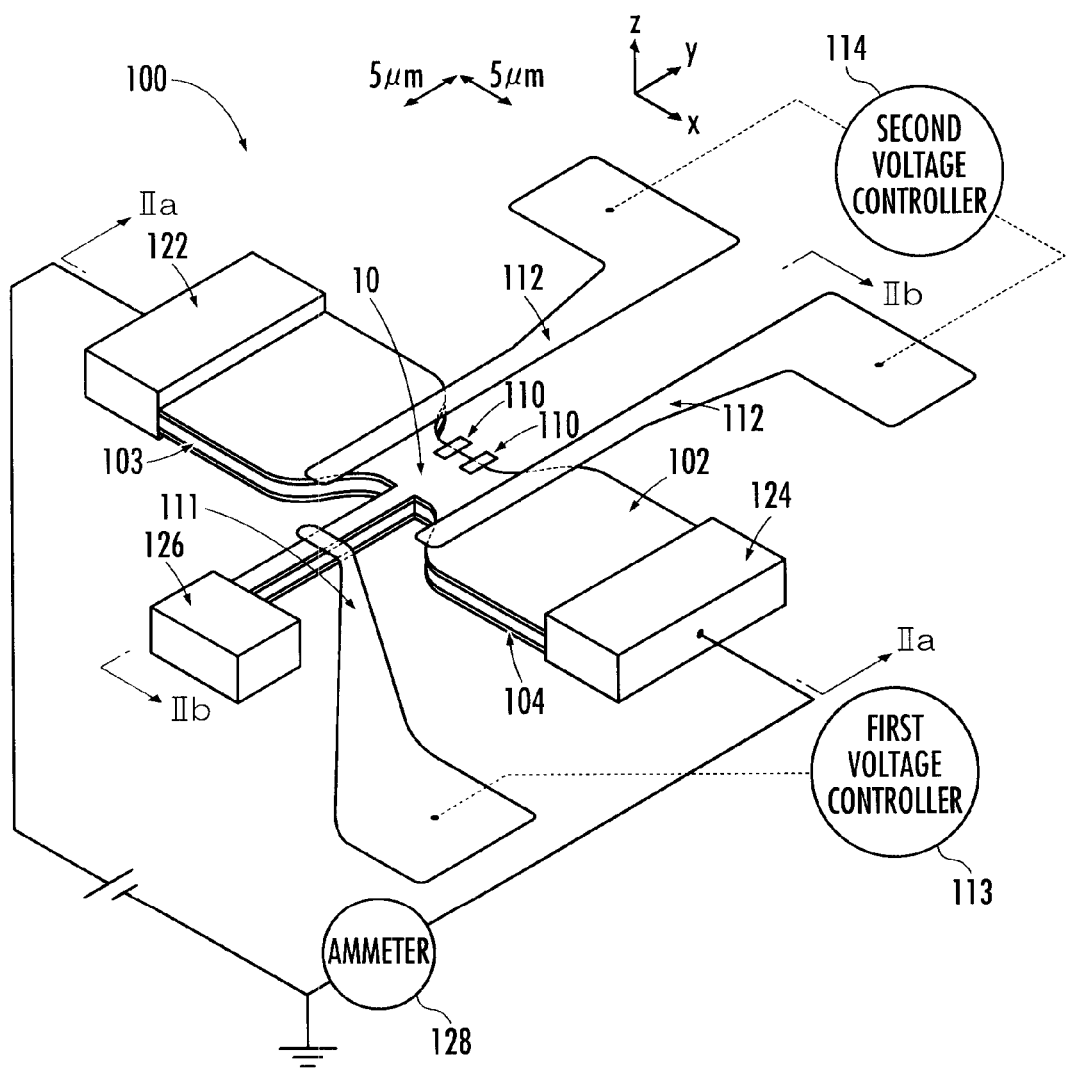
FIG. 1 is a perspective view illustrating a main part of an infrared light detector according to an embodiment of the present invention.

A structure of the infrared light detector will be described first. The infrared light detector 100 illustrated in FIG. 1 is provided with a first electronic layer 102, a second electronic layer 104, a patch antenna (or a patch portion of a microstrip antenna) 110, a first gate electrode 111, a second gate electrode 112, a first voltage controller (or a pulse generator) 113, and a second voltage controller 114. For descriptive convenience, x, y and z axes are defined as illustrated in FIG. 1.

Figure 2:
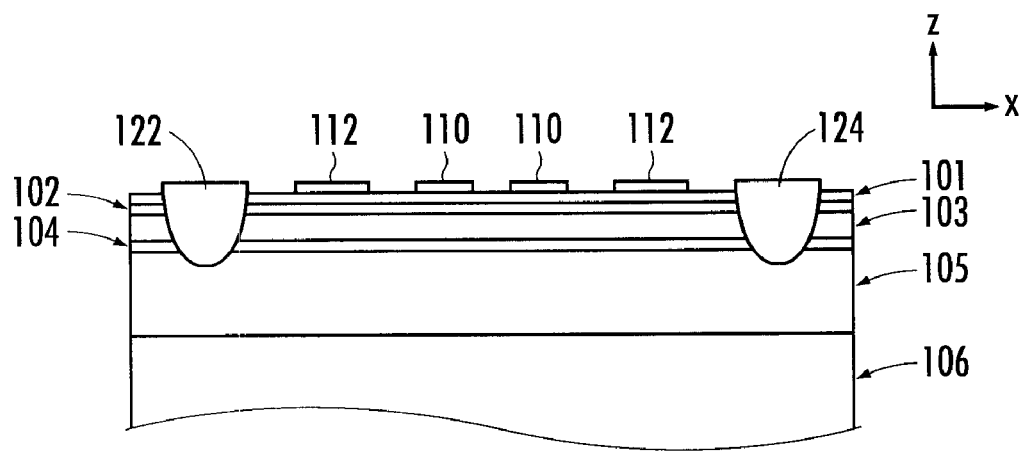
Figure 2:
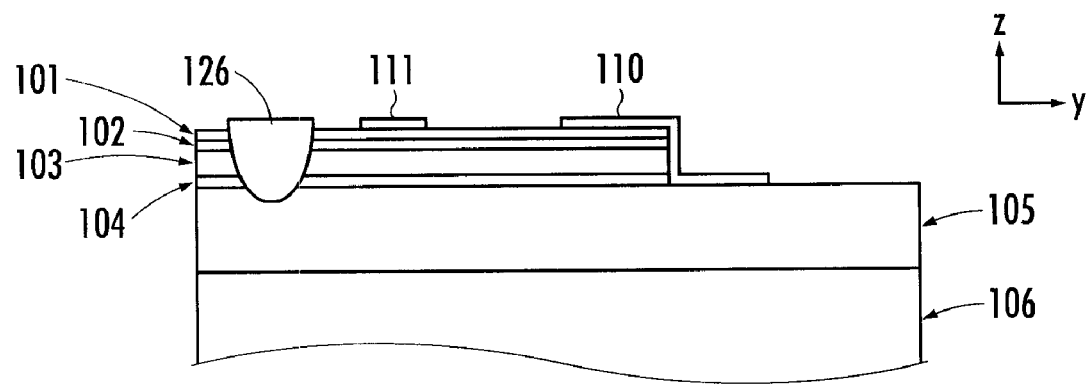
Figure 3:
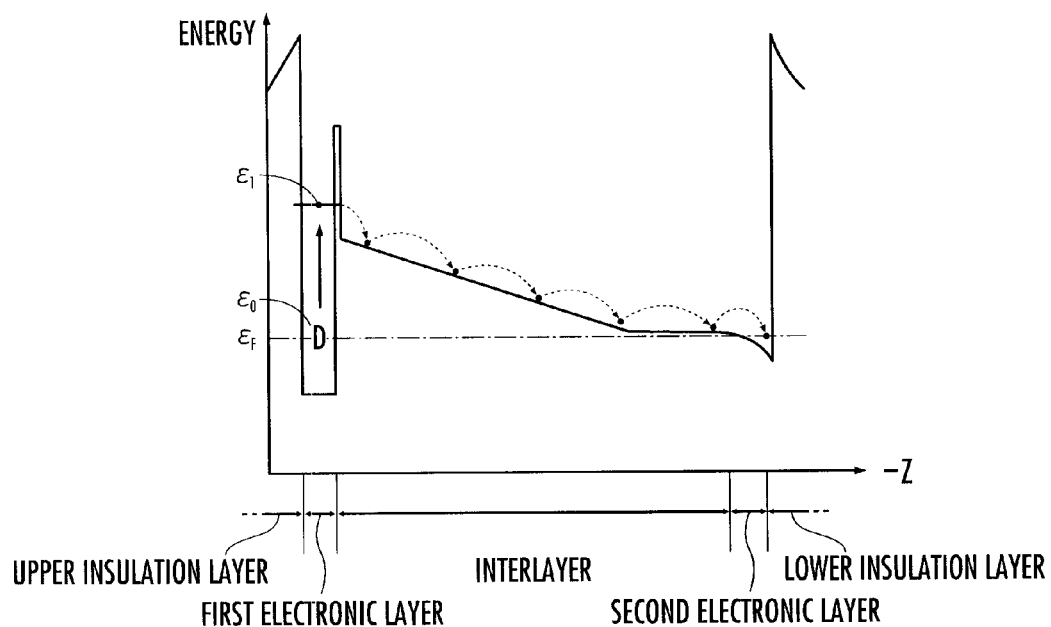
FIG. 3(a) and FIG. 3(b) are energy diagrams of the infrared light detector according to the present invention.
Figure 3:
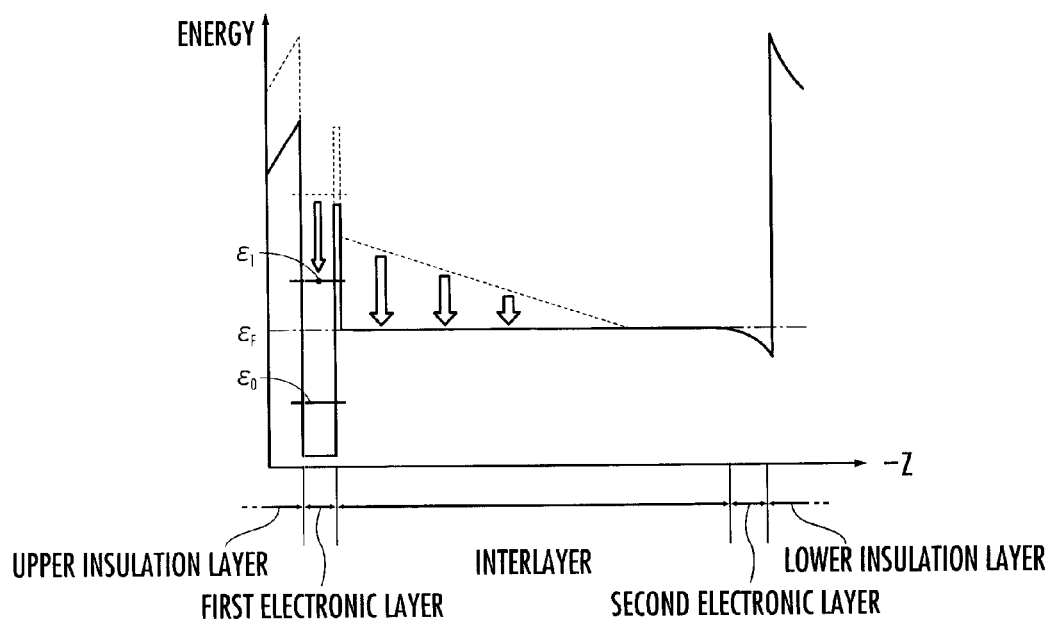

The infrared light detector 100 is made of a multilayered heteroepitaxial semi-conductor substrate disclosed in the published PCT international application WO2006/006469A1 and has a layered structure as illustrated in FIG. 2(a) and FIG. 2(b). Specifically, the substrate is of a heterojunction structure including in order from the top an upper insulation layer (GaAs layer+ Si—$Al_{0.3}Ga_{0.7}As$ layer) 101, a first electronic layer (GaAs layer) 102, an interlayer ($Al_xGa_{1-x}As$) 103, a second electronic layer (GaAs layer) 104, a lower insulation layer ($Al_{0.3}Ga_{0.7}As$ layer+ Si—$Al_{0.3}Ga_{0.7}As$ layer+ $Al_{0.3}Ga_{0.7}As$ layer) 105 and an n-type GaAs substrate 106. The composition ratio x in the interlayer 103 is adjusted so as to form an energy diagram in the depth direction (−z direction) of the substrate on an early phase of a disconnected status, as illustrated in FIG. 3(a).

As illustrated in FIG. 1, the first electronic layer 102 is formed to have a T shape, including a central region where an isolated region 10 is formed, a pair of wing-like regions of a wide width extended from both sides of the central region, respectively, and a belt-like region of a narrow width extended from the central region. The first electronic layer 102 is a two dimensional electronic layer. A quantum well is formed to have a ground sub-band level (with an energy level of $\epsilon_0$) and an excited sub-band level (with an energy level of $\epsilon_1$) in the "–z" direction in the isolated region 10 on the early phase of the disconnected status, as illustrated in FIG. 3(a).

The second electronic layer 104 is formed into the same T shape as the first electronic layer 102 and is disposed in the same posture as the first electronic layer 102 underneath the first electronic layer 102 so as to overlap with the first electronic layer 102 in the vertical direction. The second electronic layer 104 is also a two dimensional electronic layer and has an energy level lower than that of the excited sub-band level in the quantum well formed in the isolated region 10 in the first electronic layer 102 in the "–z" direction on the early phase of the disconnected status, as illustrated in FIG. 3(a).

The first electronic layer 102 and the second electronic layer 104 are connected by a first ohmic contact (source electrode) 122 at the end region of one wing-like region, a second ohmic contact (drain electrode) 124 at the end region of the other wing-like region, and a third ohmic contact 126 at the tip end of the narrow belt-like region. A current of the second electronic layer 104 is measured by an ammeter 128 connected to the first ohmic contact 122 and the second ohmic contact 124.

The patch antenna 110 is formed on the upper surface of the first electronic layer 102, covering the isolated region 10 partially. The patch antenna 110 serves as an excitation mechanism which concentrates infrared light photons and generates a vertical oscillating electric field component in the first electronic layer 102 on the isolated region 10 where the quantum well is formed, by which an electron in the isolated region 10 is excited to transition between the sub-bands. It should be noted that in addition to the patch antenna 110, various kinds of mechanisms which can generate a vertical oscillating electric field component in the first electronic layer 102 from an incident infrared light, such as a grating or an inclined plane with an inclination angle of 45° formed on a substrate (for example the upper insulation layer 101), may be applied as the excitation mechanism.

The first gate electrode 111 is formed on the upper surface of the first electronic layer 102, partitioning the isolated region 10 and the narrow belt-like region (connection region to an outer electron system) extended from the isolated region 10 in the "–y" direction. The width of the belt-like region in the x direction and the width of a portion of the first gate electrode 111 crossing the belt-like region in the y direction is configured to be sufficiently smaller with relative to the size of the isolated region 10 in the x direction and the y direction, respectively, due to the reason that an area of an overlapped portion between the first electronic layer 102 and the first gate electrode 111 is limited to satisfy a first condition to be described hereinafter.

The first voltage controller 113 applies while adjusting at the same time a bias voltage to the first gate electrode 111. According to the bias voltage applied to the first gate electrode 111, a potential barrier is formed in a region beneath the first gate electrode 111 to electrically isolate the isolated region 10 of the first electronic layer 102 in the y direction. The first gate electrode 111 and the first voltage controller 113 serve as "a status controlling mechanism" which performs switching between a "disconnected status" in which an electron from the second electronic layer 104 (corresponding to the aforementioned outer electron system), or either one of the ohmic contacts 122, 124 and 126 is limited or prohibited from flowing into the isolated region 10 and a "connected status" in which an electron from the second electronic layer 104 or the like is permitted to flow into the isolated region 10.

The second gate electrode 112 is formed on the upper surface of the first electronic layer 102, partitioning the isolated region 10 and the pair of wing-like regions sandwiching the isolated region 10. The second voltage controller 114 applies while adjusting at the same time a bias voltage to the second gate electrode 112. According to the bias voltage applied to the second gate electrode 112, a potential barrier is formed in a lower region right below the second gate electrode 112 to electrically isolate the isolated region 10 of the first electronic layer 102 in the x direction.

Subsequently, the functions of the infrared light detector with the above-mentioned structure will be described.

The bias voltage $V_{1G}$ is applied to the first gate electrode 111. According thereto, the potential barrier is formed in the lower region of the first gate electrode 111 to electrically isolate the isolated region 10 in the y direction. The area of an overlapped portion between the first electronic layer 102 and the first gate electrode 111, and the bias voltage $V_{1G}$ applied to the first gate electrode 111 are limited to satisfy the first condition that the electrical charge of the isolated region is prevented from varying when the bias voltage is applied to the first gate electrode 111 if there is no incident infrared light.

The bias voltage $V_{2G}$ is applied to the second gate electrode 112. According thereto, the potential barrier is formed in the lower region of the second gate electrode 112 to electrically isolate the isolated region 10 in the x direction. The bias voltage $V_{2G}$ applied to the second gate electrode 112 is limited to satisfy a second condition that a potential barrier is prevented from being formed in the second electronic layer 104.

Accordingly, the isolated region 10 of the first electronic layer 102 is electrically isolated from the ambient.

Figure 4:
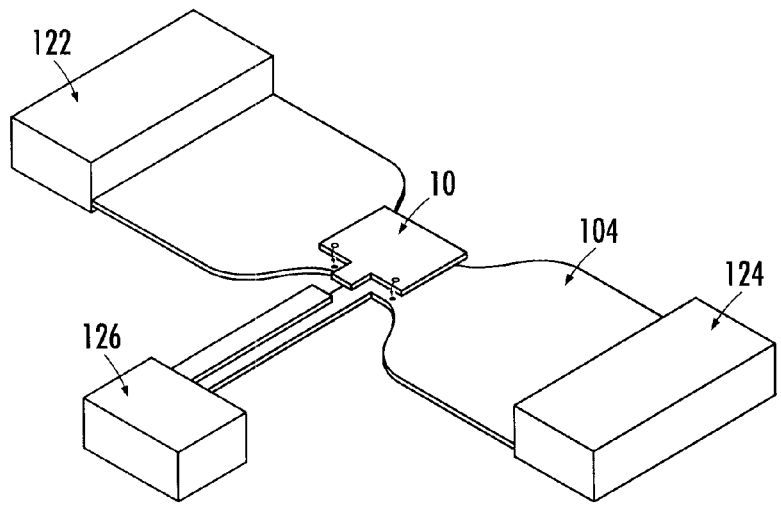
FIG. 4(a) to FIG. 4(c) are functional diagrams of the infrared light detector according to the present invention.
Figure 4:
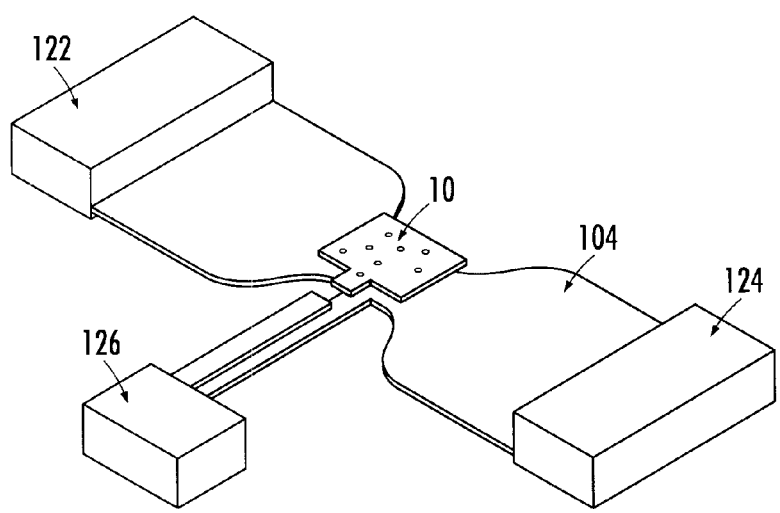
Figure 4:
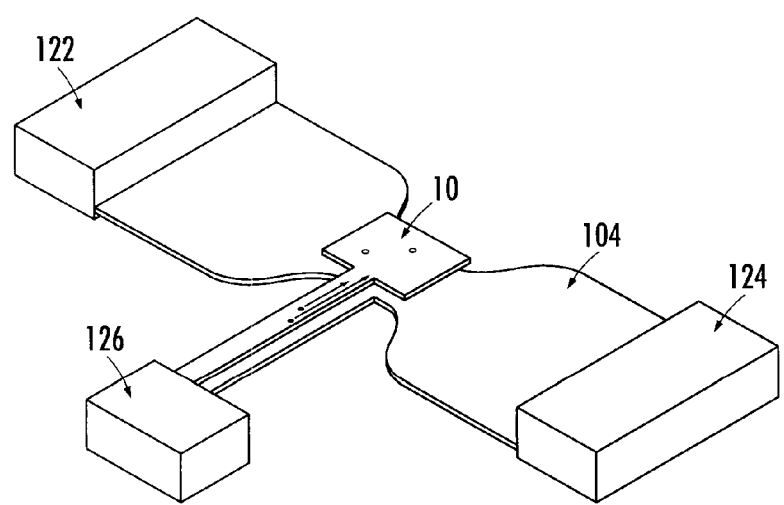

When the infrared light is incident on the infrared light detector 100, an oscillating electrical filed is formed in the first electronic layer 102 in the vertical direction (z direction) by the patch antenna 110. An electron in the isolated region 10 is excited from the ground sub-band level of the quantum well formed in the isolated region 10 to the excited sub-band level thereof by the oscillating electric field, as illustrated by the upper directed arrow in FIG. 3(a). As illustrated in FIG. 3(a) by the dashed arrow, the excited electron to the excited sub-band level tunnels the potential barrier of the quantum well. Then, it flows into the second electronic layer 104 along an energy inclination in the interlayer 103. According thereto, the isolated region 10 is positively charged or ionized. Specifically, the isolated region 10 of the first electronic layer 102 and the lower region in the second electronic layer 104 which is located below the isolated region 10 function as a condenser sandwiching the interlayer 103 in the disconnected status to accumulate positive charges in the isolated region 10. FIG. 4(a) schematically illustrates that electrons (represented by filled circles) flow into the second electronic layer 104 from the isolated region 10 as illustrated by the arrows and positive charges (represented by white circles) are generated in the isolated region 10.

As a consequence of continuous falling of the incident infrared light on the infrared light detector 100, total electrons escaped from the isolated region 10 of the first electronic layer 102 to the second electronic layer 104 are gradually increased, in parallel, the electrical charge of the isolated region 10 is gradually increased. According to the gradual increment on the electrical charge of the isolated region 10, the electron density in the lower region in the second electronic layer 104 below the isolated region 10, and consequently the electrical conductivity of the second electronic layer 104, becomes greater gradually. Therefore, the infrared light can be detected at a high sensitivity according to the measured value of the ammeter 128 by detecting the temporal variation rate of the electrical conductivity of the second electronic layer 104 or variation amount of the electrical conductivity of the second electronic layer 104 after a certain time interval since the reset is performed.

On the other hand, when the positive charges of the isolated region 10 are gradually increased, the energy of the isolated region 10 is gradually decreased with respect to the energy of the second electronic layer 104. Accordingly, the energy diagram varies from a state as illustrated in FIG. 3(a) to another state as illustrated in FIG. 3(b). The energy level $\epsilon_1$ of the excited sub-band level in the isolated region 10 approaches to the energy level of the second electronic layer 104 where the escaped electron is from. Because of this, it becomes difficult for the electrons in the isolated region 10 of the first electronic layer 102 to escape substantially to the second electronic layer 104. That is, the electrical charge of the isolated region 10 becomes saturated. As a result thereof, even though the incident infrared light is kept falling, the electrical conductivity of the first electronic layer 102 will not vary any further, which makes it impossible to continuously detect the infrared light according to the temporal variation rate of the electrical conductivity or the variation amount of the electrical conductivity after a certain time interval since the reset is performed. FIG. 4(b) schematically illustrates that the electrical charge of the isolated region 10 has been saturated due to the accumulation of multiple positive charges (represented by white circles).

In regard to the problem, the bias voltage applied to the first gate electrode 111 is lowered before the variation amount of the electrical conductivity of the second electronic layer 104 becomes saturated by the first voltage controller 113. The first voltage controller 113 detects the timing when the variation amount of the electrical conductivity of the second electronic layer 104 becomes saturated on the basis of an output from the ammeter 128. Thus, the potential barrier present between the isolated region 10 of the first electronic layer 102 and the second electronic layer 104 in the disconnected status is eliminated. The isolated region 10 is switched from the disconnected status to the connected status where an electron from the outer electron system such as the second electronic layer 104 or the like is permitted to flow into the isolated region 10. Thereby, the electron flows from the second electronic layer 104 into the isolated region 10 through the third ohmic contact 126. The electron couples with a positive charge in the isolated region 10 to reset the electrical charge thereof to zero instantly. FIG. 4(c) schematically illustrates that the second electronic layer 104 is electrically connected with the isolated region 10 through the third ohmic contact 126, the electrons (represented by filled circles) flow into the isolated region 10 as shown by the arrows to couple with the positive charges (represented by white circles).

Thereafter, by switching the isolated region 10 from the connected status to the disconnected status, the energy diagram is recovered from the state illustrated in FIG. 3(b) back to the state illustrated in FIG. 3(a). In other words, the energy level $\epsilon_1$ of the excited sub-band level in the isolated region 10 is recovered to a level sufficiently high for the electron transitioned to the excited sub-band level to be able to flow from the isolated region 10 into the second electronic layer 104.

Figure 5:
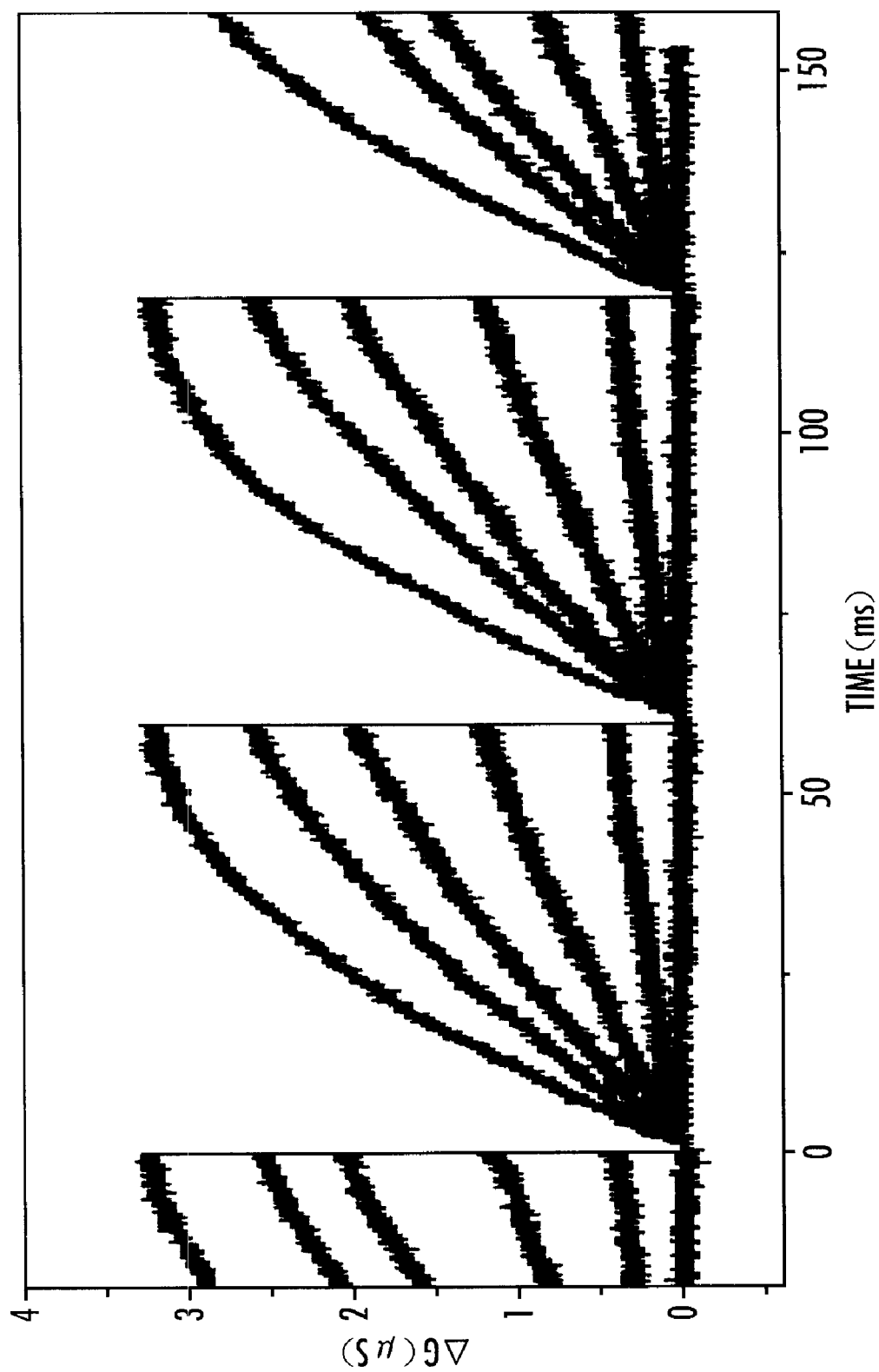
FIG. 5 is an experimental result of the infrared light detector according to the present invention.

In a liquid helium temperature environment, the variation amount $\Delta G$ (µS) of the electrical conductivity of the second electronic layer 104 in relation to the incident infrared light of various intensity was measured in a time series by iterating the switching between the disconnected status and the connected status of the first electronic layer 102. The experimental result is shown in FIG. 5. The variation amount $\Delta G$ of the electrical conductivity repeats a pattern of gradually increasing when the first electronic layer 102 is in the disconnected status, and decreasing close to zero when the electrical charge of the first electronic layer 102 is reset to zero as the first electronic layer 102 is switched to the connected status. It is obvious from the determination result that when the first electronic layer 102 is switched alternatively between the disconnected status and the connected status, the variation $\Delta G$ of the electrical conductivity of the second electronic layer 104 as the first electronic layer 102 is in the disconnected status is detected accumulatively or integrated with time in relation to the amount of the incident infrared light or the number of holes (refer to FIG. 4(a) and FIG. 4(b)) resulted from the incident infrared light, which contributes to the remarkable improvement on the detection sensitivity of the infrared light detector 100. In other words, the infrared light detector 100 is endowed with a linear responsibility; therefore, the remarkable improvement on the detection sensitivity thereof in an extremely wide range of light intensity can be expected.

Further, the area of an overlapped portion between the first electronic layer 102 and the first gate electrode 111, and the bias voltage $V_{1G}$ applied to the first gate electrode 111 are limited to satisfy the first condition. Thereby, the electrical charge of the isolated region can be prevented from being varied when there is no incident infrared light by applying the bias voltage $V_{1G}$ to the first gate electrode 111.

Specifically, by applying the bias voltage $V_{1G}$ to the first gate electrode 111, the number of electrons forced to flow from the region beneath the first gate electrode 111 in the first electronic layer 102 to the isolated region 10 is inhibited. Herein, "an electron is forced to flow into the isolated region 10 from the region beneath the first gate electrode 111 in the first electronic layer 102" means that a region where an electron is removed repulsively thereof becomes wider according to the potential barrier formed in the lower region in the first electronic layer 102, therefore, the isolated region 10 becomes smaller essentially. As a result thereof, (1) Electrons in the isolated region 10 become concentrated after the electron is forced into the isolated region 10, therefore, the positive electrical charge in the isolated region 10 can be prevented from decreasing or the negative electrical charge thereof is prevented from increasing regardless of the incident infrared light. (2) Electrons in the isolated region 10 become concentrated after the electron is forced into the isolated region 10, the Fermi level in the isolated region 10 is increased; therefore, partial electrons are prevented from escaping from the isolated region 10 to the second electronic layer 104 or the like. Since the electrical charge of the isolated region 10, and consequently, the electrical conductivity of the second electronic layer 104 are prevented from varying when there is no incident infrared light, the infrared light detection sensitivity can be maintained at a high level. It is especially significant in maintaining the infrared light detection sensitivity of a compact infrared light detector 100 at a high level.

Furthermore, the bias voltage $V_{2G}$ applied to the second gate electrode 112 is so limited as to satisfy the second condition. According thereto, the potential barrier can be prevented from being formed not only in the first electronic layer 102 but also in the second electronic layer 104 located lower of the first electronic layer 102 according to the application of the bias voltage $V_{2G}$ to the second gate electrode 112, and consequently, the infrared light detection sensitivity can be prevented from decreasing.

Figure 6:
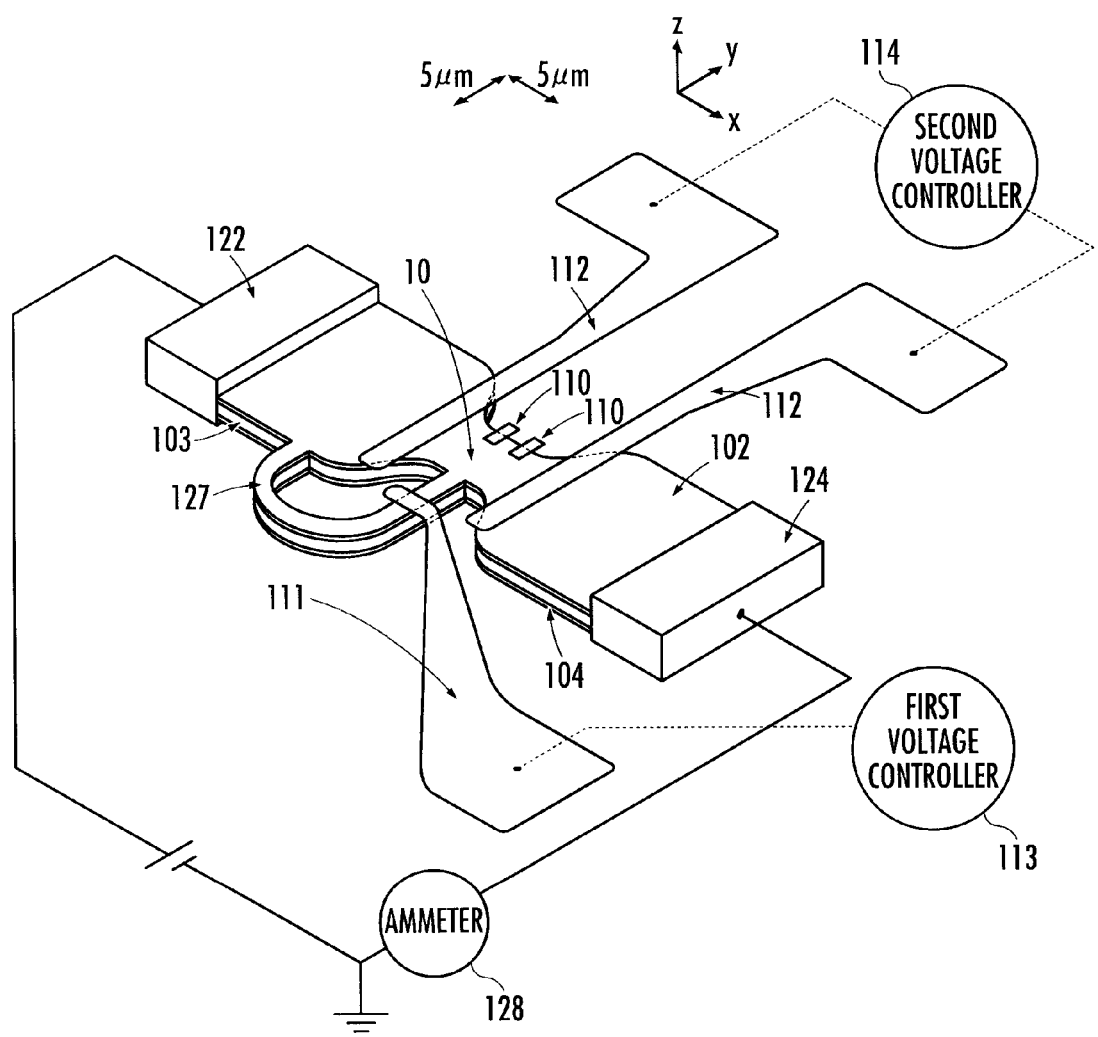
FIG. 6 is a perspective view illustrating a main part of an infrared light detector according to another embodiment of the present invention.

It is acceptable to use the infrared light detector 100 having a P shape as illustrated in FIG. 6 as an alternative to the infrared light detector 100 having a T shape as illustrated in FIG. 1. In the aforementioned embodiment, the electrical charge of the isolated region 10 is reset by making the electron in the second electronic layer 104 flow into the isolated region 10; as another embodiment, it is acceptable to reset the electrical charge of the isolated region 10 by making electron in an outer electron system, such as the first ohmic contact (source electrode) 122 or the second ohmic contact (drain electrode) 124, which is different from the second electronic layer 104, flow into the isolated region 10. In the infrared light detector 100 illustrated in FIG. 6, the first electronic layer 102 is formed to have a P shape, including a central region where the isolated region 10 is formed, a pair of wing-like regions of a wide width extended from both sides of the central region, respectively, and a loop-like region 127 connected to the central region and one of the wing-like regions. The second electronic layer 104 is formed to have the same P shape as the first electronic layer and is disposed to overlap with the first electronic layer in a vertical direction. The loop-like region 127 is electrically connected with the isolated region 10 through the first gate electrode 111 and the first ohmic contact 122 in the first electronic layer 102, bypassing the second gate electrode 112. According to this structure, the electron from the first ohmic contact 122 can flow into the isolated region 10 through the loop-like region 127.

What is claimed is:

1. An infrared light detector, comprising:
   a first electronic layer as a two dimensional electronic layer;
   an excitation mechanism configured to excite an electron n in the first electronic layer between sub-bands in a quantum well formed in an electrically isolated region by an oscillating electric field component perpendicular to the first electronic layer induced by an incident infrared light; and
   a second electronic layer disposed below the first electronic layer through an interlayer within a distance by which an electrostatic force of the first electronic layer influences on the second electric layer, whose electrical conductivity varies because of an electrical charge of the isolated region varied by the flowing out of the electron excited by the excitation mechanism from the isolated region,
   which detects the incident infrared light by detecting a variation pattern on the electrical conductivity of the second electronic layer,
   wherein the infrared light detector includes a status controlling mechanism configured to perform switching between a disconnected status in which an electron from an outer electron system is limited or prohibited from flowing into the isolated region and a connected status in which an electron from the outer electron system is permitted to flow into the isolated region according to the detection result of the variation pattern on the electrical conductivity of the second electronic layer in detecting the infrared light.

2. The infrared light detector according to claim 1, wherein the status controlling mechanism includes
   a first gate electrode formed on an upper surface of the first electronic layer to separate the isolated region from a connection region in the first electronic layer where the outer electron system is connected, and
   a first voltage controller configured to adjust a magnitude of a potential barrier formed between the isolated region and the connection region in the first electronic layer by controlling a bias voltage applied to the first gate electrode.

3. The infrared light detector according to claim 2, wherein an area of an overlapped portion between the first electronic layer and the first gate electrode, and the bias voltage applied to the first gate electrode are controlled to satisfy a first condition that the electrical charge of the isolated region is prevented from being varied by the bias voltage applied to the first gate electrode if there is no incident infrared light.

4. The infrared light detector according to claim 1, wherein the status controlling mechanism performs switching between the disconnected status and the connected status in detecting the infrared light, taking the second electronic layer or an ohmic contact connected to the second electronic layer as the outer electronic system.

5. The infrared light detector according to claim 1, wherein the status controlling mechanism performs switching from the disconnected status to the connected status in accordance with the variation pattern on the electrical conductivity of the second electronic layer in the disconnected status before a variation amount of the electrical conductivity becomes saturated.

6. The infrared light detector according to claim 1, wherein
   the first electronic layer is respectively connected to a source electrode and a drain electrode which are connected to the second electronic layer so as to determine the electrical conductivity of the second electronic layer,
   the first electronic layer includes
   a second gate electrode formed on a upper surface of the first electronic layer to partition the isolated region and a connection region in the first electronic layer where the source electrode and the drain electrode are connected, respectively, and
   a second voltage controller configured to forma potential barrier between the isolated region and the connection region in the first electronic layer by controlling a bias voltage applied to the second gate electrode.

7. The infrared light detector according to claim 6, wherein the bias voltage applied to the second gate electrode is controlled to satisfy a second condition that a variation amount or variation rate of the electrical conductivity of the second electronic layer due to the potential barrier formed in the second electronic layer is prevented from decreasing or disappearing.

8. The infrared light detector according to claim 1, wherein
   the first electronic layer is of a T shape, including a central region where the isolated region is formed, a pair of wing-like regions of a wide width extended from both sides of the central region, respectively, and a belt-like region of a narrow width extended from the central region;
   the second electronic layer is of the same shape as the first electronic layer and is disposed to overlap with the first electronic layer in a vertical direction;
   the wing-like region at the left side of the first electronic layer and the second electronic layer, respectively, is connected with a first ohmic contact, the wink-like region at the right side thereof is connected with a second ohmic contact, and the belt-like region is connected with a third ohmic contact;
   the status controlling mechanism includes
   a first gate electrode formed on an upper surface of the belt-like region in the first electronic layer to separate the central region from the third ohmic contact, and
   a first voltage controller configured to adjust a magnitude of a potential barrier formed between the central region and the third ohmic contact in the first electronic layer by controlling a bias voltage applied to the first gate electrode;

the infrared light detector includes a second gate electrode formed on an upper surface of the first electronic layer without overlapping with the belt-like region to separate the central region from the pair of wing-like regions, and a second voltage controller configured to forma potential barrier for defining the isolated region between the central region and the pair of wing-like region in the first electronic layer by adjusting a bias voltage applied to the second gate electrode.

9. The infrared light detector according to claim 1, wherein the first electronic layer is of a P shape, including a central region where the isolated region is formed, a pair of wing-like regions of a wide width extended from both sides of the central region, respectively, and a loop-like region connected to the central region and one of the wing-like regions;

the second electronic layer is of the same shape as the first electronic layer and is disposed to overlap with the first electronic layer in a vertical direction;

the wing-like region at the left side of the first electronic layer and the second electronic layer, respectively, is connected with a first ohmic contact, the wink-like region at the right side thereof is connected with a second ohmic contact, and the belt-like region is connected with a third ohmic contact;

the status controlling mechanism includes a first gate electrode formed on an upper surface of the loop-like region in the first electronic layer to separate the central region from the third ohmic contact, and a first voltage controller configured to adjust a magnitude of a potential barrier formed between the central region and the third ohmic contact in the first electronic layer by controlling a bias voltage applied to the first gate electrode;

the infrared light detector includes a second gate electrode formed on an upper surface of the first electronic layer without overlapping with the loop-like region to separate the central region from the pair of wing-like regions, and a second voltage controller configured to form a potential barrier for defining the isolated region between the central region and the pair of wing-like region in the first electronic layer by adjusting a bias voltage applied to the second gate electrode.

* * * * *